United States Patent
Liu et al.

(10) Patent No.: US 8,575,634 B2
(45) Date of Patent: Nov. 5, 2013

(54) CHIP PACKAGE AND METHOD FOR FABRICATING THE SAME

(76) Inventors: Tsang-Yu Liu, Hsinchu (TW); Yu-Lin Yen, Taoyuan (TW); Chuan-Jin Shiu, Taoyuan (TW); Po-Shen Lin, Taipei (TW)

( * ) Notice: Subject to any disclaimer, the term of this patent is extended or adjusted under 35 U.S.C. 154(b) by 124 days.

(21) Appl. No.: 12/981,600

(22) Filed: Dec. 30, 2010

(65) Prior Publication Data

US 2011/0156074 A1 Jun. 30, 2011

Related U.S. Application Data

(60) Provisional application No. 61/291,445, filed on Dec. 31, 2009.

(51) Int. Cl.
*H01L 33/60* (2010.01)
*H01L 33/48* (2010.01)

(52) U.S. Cl.
USPC ............................................. 257/98; 438/26

(58) Field of Classification Search
USPC ................ 257/98, E33.056, E33.072; 438/26
See application file for complete search history.

(56) References Cited

U.S. PATENT DOCUMENTS

| 6,036,872 A * | 3/2000 | Wood et al. ......................... 216/2 |
| 2005/0184304 A1 * | 8/2005 | Gupta et al. ..................... 257/98 |

* cited by examiner

*Primary Examiner* — Matthew W Such
*Assistant Examiner* — Monica D Harrison
(74) *Attorney, Agent, or Firm* — Birch, Stewart, Kolasch & Birch, LLP

(57) ABSTRACT

The present invention provides a chip package, including: a chip having a semiconductor device thereon; a cap layer over the semiconductor device; a spacer layer between the chip and the cap layer, wherein the spacer layer surrounds the semiconductor device and forms a cavity between the chip and the cap layer; and an anti-reflective layer between the cap layer and the chip, wherein the anti-reflective layer has a overlapping region with the spacer layer and extends into the cavity. Furthermore, a method for fabricating a chip package is also provided.

21 Claims, 16 Drawing Sheets

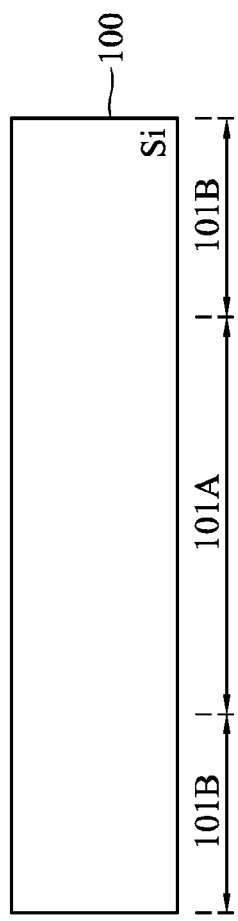
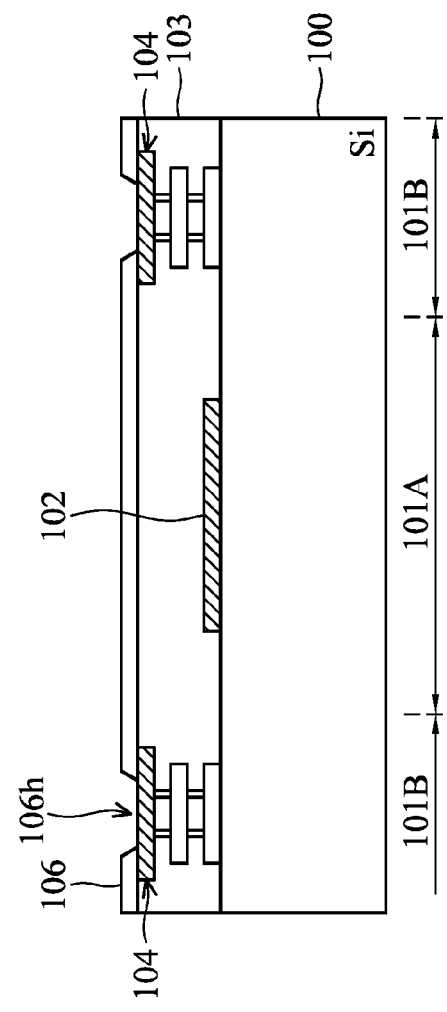

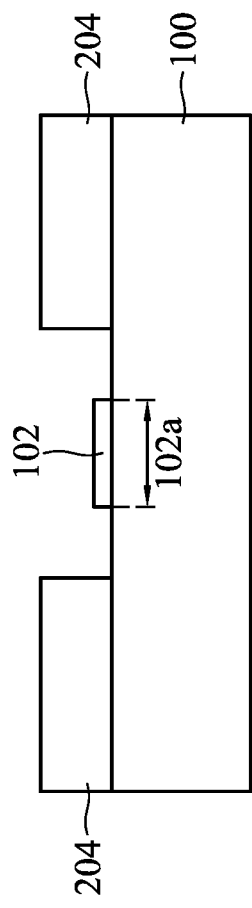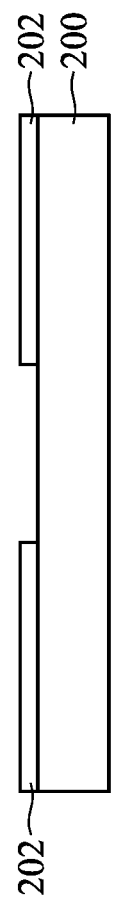
FIG. 4A
FIG. 4B

CHIP PACKAGE AND METHOD FOR FABRICATING THE SAME

CROSS REFERENCE TO RELATED APPLICATIONS

This application claims the benefit of U.S. Provisional Application No. 61/291,445 filed on Dec. 31, 2009, entitled "CHIP PACKAGE AND FABRICATION METHOD THEREOF," which application is hereby incorporated herein by reference.

BACKGROUND OF THE INVENTION

1. Field of the Invention

The present invention relates to a chip package and method for fabricating the same, and in particular, relates to a chip package having an anti-reflective layer and method for fabricating the same.

2. Description of the Related Art

For conventional image sensor packages, optical crosstalk, is one event negatively affecting image quality thereof. When optical crosstalk is serious, images of a conventional image sensor are distorted. For example, optical crosstalk occurs when light, incident to a non-photo-sensitive region or an adjacent image sensor device of an image sensor, is refracted onto a sensing region of an image sensor. Additionally, light leakage due to light leaking out of a package structure of a sensing region may also decrease image quality of a conventional image sensor.

Thus, a novel chip package and a method for fabricating the same are desired.

BRIEF SUMMARY OF THE INVENTION

One of the broader forms of an embodiment of the present invention involves a chip package. The chip package includes: a chip having a semiconductor device thereon; a cap layer over the semiconductor device; a spacer layer between the chip and the cap layer, wherein the spacer layer surrounds the semiconductor device and forms a cavity between the chip and the cap layer; and an anti-reflective layer between the cap layer and the chip, wherein the anti-reflective layer has a overlapping region with the spacer layer and extends into the cavity.

Another one of the broader forms of an embodiment of the present invention involves a method for fabricating the chip package. The method includes: providing a cap layer and a wafer including a plurality of chips, wherein each of the chips has a semiconductor device thereon; bonding the cap layer and the wafer with a spacer layer and an anti-reflective layer therebetween, wherein the spacer layer surrounds the semiconductor device and forms a cavity between the cap layer and the chip, and the anti-reflective layer extends to the cavity, wherein the anti-reflective layer has an overlapping region with the spacer layer.

A detailed description is given in the following embodiments with reference to the accompanying drawings.

BRIEF DESCRIPTION OF THE DRAWINGS

The present invention can be further understood by reading the subsequent detailed description and examples with references made to the accompanying drawings, wherein:

FIGS. 1A and 1B illustrate cross section views of a wafer in accordance with one embodiment of the present invention;

FIGS. 4A through 4D illustrate cross views of intermediate stages when forming a chip package in accordance with yet one embodiment of the present invention.

DETAILED DESCRIPTION OF THE INVENTION

Figure 2A:
FIGS. 2A through 2H illustrate cross views of intermediate stages when forming a chip package in accordance with one embodiment of the present invention.

The present invention will be illustrated in detail with references made to the accompanying drawings. In the drawings or the description, similar or same reference numbers are used to designate similar or same elements. In addition, sizes or shapes of elements shown in the drawings may be expanded for clarity or simplicity. Further, each element shown in the drawings will be illustrated. It should be understood that any element not shown or described may be any kind of conventional element as known by those skilled in the art. In addition, a specific embodiment is merely an example disclosing a specific use of the invention, which is not used to limit the present invention.

Embodiments of the chip packages of the present invention packaged by a wafer level packaging (WSP) process may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer level packaging (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer level packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form electronic device packages of multi-layered integrated circuit devices by stacking a plurality of wafers having integrated circuits together.

An image sensor is used as an exemplary embodiment of a chip package of the present invention. An anti-reflective layer is disposed between a chip and a cap layer of the chip package, to decrease optical crosstalk from occurring in conventional technology resulting from light incident to a non-photo-sensitive region (for example, light is incident to a spacer layer) refracting to a sensing region or light incident to an adjacent image sensor device. Additionally, the anti-reflective layer can eliminate light leakage, due to light incident to the sensing region reflecting out of the chip package. Therefore, the image quality can be improved.

A semiconductor substrate is firstly provided. For example, a semiconductor wafer such as a silicon wafer is provided. A III-V compound semiconductor substrate such as an SiGe or GaAs substrate may also be used. Alternatively, the semiconductor substrate may be a doped epi layer or a gradient semiconductor layer and/or further a semiconductor layer on another different type semiconductor layer. Please refer to FIG. 1, a wafer 100 is provided first. The wafer 100 has a plurality of defined device regions 101A. A plurality of peripheral bonding pad regions 101B surrounds the device regions 101A. The device regions 101A and the peripheral bonding pad regions 101B together, form a portion of a chip region.

Next, as shown in FIG. 1B, a semiconductor device 102 such as image sensors or micro-mechanical systems (MEMS) is fabricated in the device region 100A. An intermetal dielectric (IMD) layer 103 covers the semiconductor substrate 100 and the semiconductor device 102. Generally, low k insulating materials such as a porous oxide layer may be selected for the intermetal dielectric layer 103. Next, a plurality of conductive pad structures 104 are fabricated in the intermetal dielectric layer 103 in the peripheral bonding pad regions 100B. The conductive pad structures 104 may be preferably formed of Cu, or Al or other suitable metal materials.

Additionally, the semiconductor substrate 100 may be covered by a passivation layer 106 with is capable of electrically connecting devices in the chip to outside circuits. The chip passivation layer 106 may be pre-defined to form a plurality of openings 106h exposing the conductive pad structures 104.

FIGS. 2A through 2H, FIGS. 3A through 3B, FIGS. 4A through 4D, and FIGS. 5A through 5D are illustrated cross section views of intermediate stages when forming the chip packages in accordance with various embodiments of the present invention. The steps of fabricating the chip packages includes providing a cap layer 200 for bonding with a wafer 100, wherein an anti-reflective layer and a spacer layer are disposed therebetween. In an embodiment, the cap layer 200 can allow light to pass therethrough, and the cap layer 200 may be formed of transparent materials comprising eyeglasses level glasses or quartz.

Referring to FIGS. 2A through 2H, illustrated are cross section views of intermediate stages when forming a chip package. Referring to FIG. 2A firstly, a patterned anti-reflective layer 202 is formed on the cap layer 200. The cap layer 200 may be formed by coating and photolithography/etching processes. In one embodiment, materials having light blocking, light absorbing or light reflection characteristics may be selected for the anti-reflective layer 202. For example, the anti-reflective layer 202 may comprise a black resin, bottom anti-reflective coating (BARC), metal materials such as chromium (Cr), or other organic/inorganic light absorbing materials such as a dye or pigment. Furthermore, the anti-reflective layer 202 may comprise a plurality of films which absorb light of different wavelengths. For example, each of the films may have an individual wavelength range for absorbing light, or in addition, the wavelength ranges which may be complementary to each other.

Figure 2B:
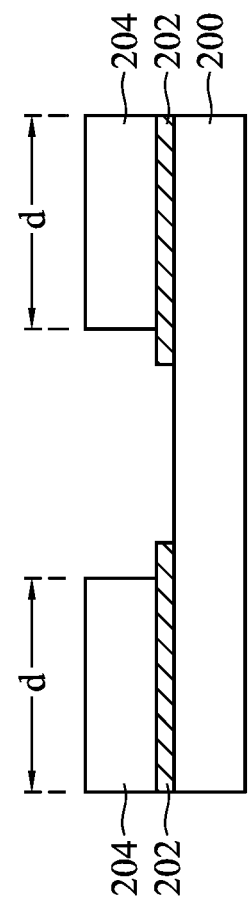

Next, referring a FIG. 2B, illustrated is a formation of spacer layer 204. The spacer layer 204 may be formed on the cap layer 200. The cap layer 200 may be formed by processes such as deposition and photolithography processes. As shown in FIG. 2B, the spacer layer 204 is disposed between any two adjacent anti-reflective layers 202, wherein the anti-reflective layer 202 has an overlapping region d with the underlying spacer layer 204. The overlapping region d can be used for mounting of the anti-reflective layer 202, and in addition, the overlapping region d can be used to prevent light from being directly transmitted through the spacer layer 204. In one embodiment, isolation materials may be selected for the spacer layer 204 to prevent contamination or moisture from penetrating therethrough. For example, when a notching process is performed on a wafer substrate to form a cavity 216, buffer materials may be selected for the spacer layer 204 to prevent the cap layer from breaking. Additionally, when the chip comprises opto electronic devices, the spacer layer 204 may be formed as a dam structure; thereby forming a cavity 216 between the cap layer 200 for light to transmit therethrough and the optical electronic devices with surrounded by the spacer layer 204. Optical characteristics of the optical electronic devices may be improved due to the air in the cavity. In another embodiment, materials of the spacer layer 204 may be light sensitive epoxy resin, or a solder mask or other suitable insulating materials, such as, silicon oxide, silicon nitride, silicon oxynitride, metal oxide or combinations thereof of inorganic materials, or polyimide (PI), butylcyclobutene (BCB), parylene, polynaphthalenes, fluorocarbons, or acrylates of organic materials.

Figure 2C:
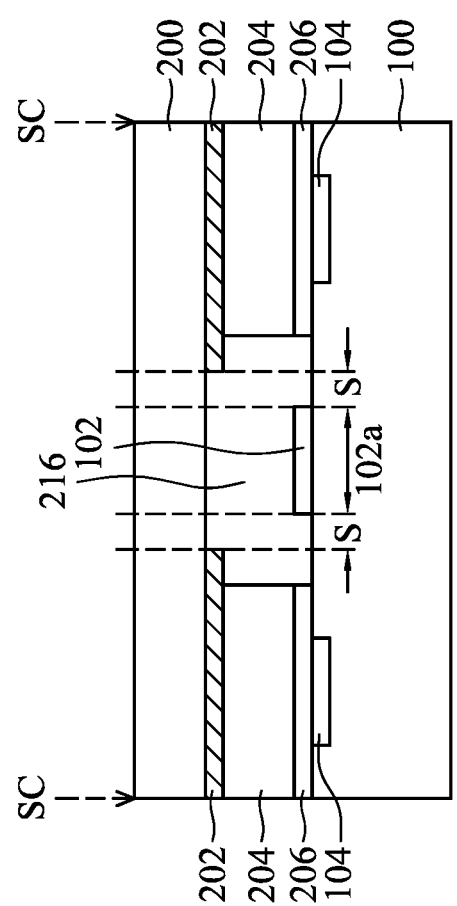

Next, as shown in FIG. 2C, an adhesive layer 206 is formed on the spacer layer. In one embodiment, the adhesive layer may comprise a polymer film, or one or more of adhesives such as epoxy or polyurethane. In one embodiment, the cap layer 200 may be bonded to the wafer 100 via the adhesive layer 206 disposed on the spacer layer 204, wherein the spacer layer 204 is between the wafer 100 and the cap layer 200 to form a cavity 216 between the wafer 100 and the cap layer 200. In the cavity, the device region is surrounded by the spacer layer 204. In this embodiment, the wafer 100 may comprise a plurality of chips, and each chip is isolated by a scribe line SC. As shown in FIG. 2C, a semiconductor device 102 is disposed on each chip with a corresponding micro array structure (not shown) covered thereon. In the present embodiment, the semiconductor device 102 may be a photo-sensing device 102, and the region where the photo-sensing device is disposed can be regarded as a photosensitive region 102a. In one embodiment, the light sensing device may be a complementary metal-oxide-semiconductor (CMOS) device or a charge-coupled device (CCD) used for sensing images or pictures.

It should be noted that, as shown in FIG. 2C, the anti-reflective layer 202 covers the top surface of the spacer layer 204, and in addition, a portion of the anti-reflective layer 202 extends into the cavity 216 to prevent light from being incident to a non-photo-sensitive region and prevent light from being refracted to a sensing region or light incident to an adjacent image sensor device. However, it can be realized that the photo-sensing device 102 and the anti-reflective layer 202 have a horizontal spacing distance S therebetween, to prevent light being incident to the photosensitive region 102a from being blocked by the anti-reflective layer 202. In one embodiment, the horizontal spacing distance S between the photo-sensing device 102a and the anti-reflective layer 202 may be between about 2 µm and about 100 µm. Preferably, the horizontal spacing distance S between the photo-sensing device 102 and the anti-reflective layer 202 may be between about 5 µm and about 40 µm.

Figure 2D:
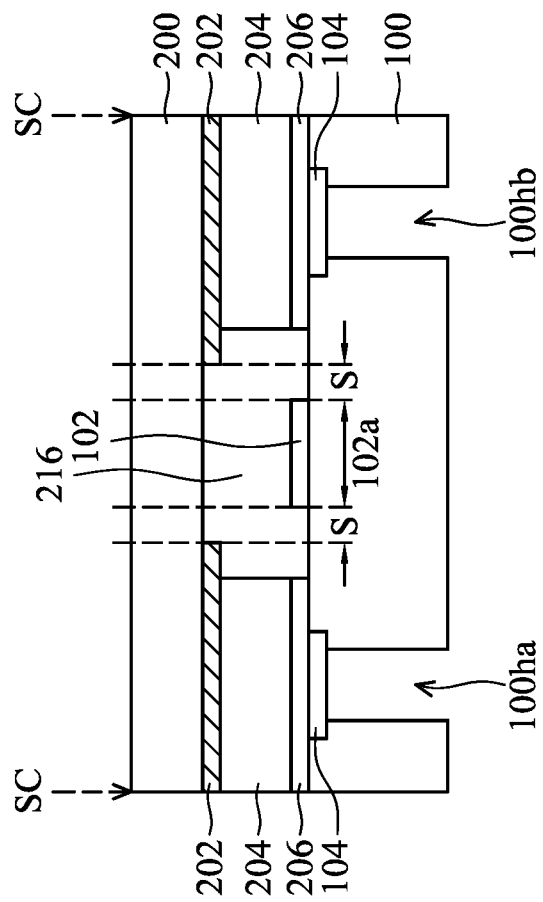

Please refer to FIG. 2D. The cap layer 200 may serve as a carrier substrate for an etching process performed on a backside 100a of the wafer 100. For example, a portion of the wafer 100 is removed by processes such as an anisotropic etching process to form openings 100ha and 100hb therein, exposing the conductive pad structures 104.

Figure 2E:
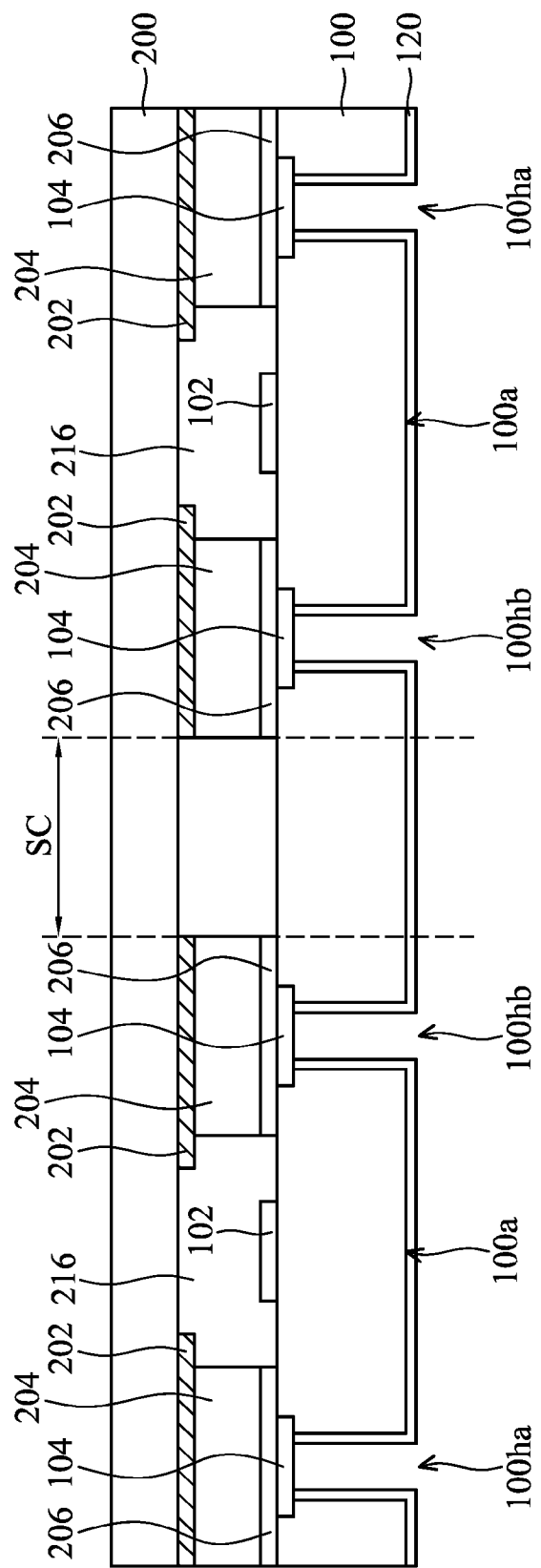

FIG. 2E is a cross section showing the wafer 100 with a large range. FIG. 2E further shows an adjacent cutting region and another chip region in addition to the portion of the chip region as shown in FIG. 2E.

As shown in FIG. 2E, an insulating layer made of, polymer such as a polyimide film, exposing the conductive pad structure 104 is optionally formed in the openings 100ha and 100hb. A silicon oxide layer 120 may be formed in the openings 100ha and 100hb extending to the backside 100a of the wafer 100 by a thermal oxidation or plasma chemical deposition method. Next, the insulating layer on a bottom of the openings 100ha and 100hb is removed (by processes such as a lithography process) to expose the conductive pad structures 104. In this embodiment, the insulating layer 120 in the openings 100ha and 100hb are formed at the same time.

Figure 2F:
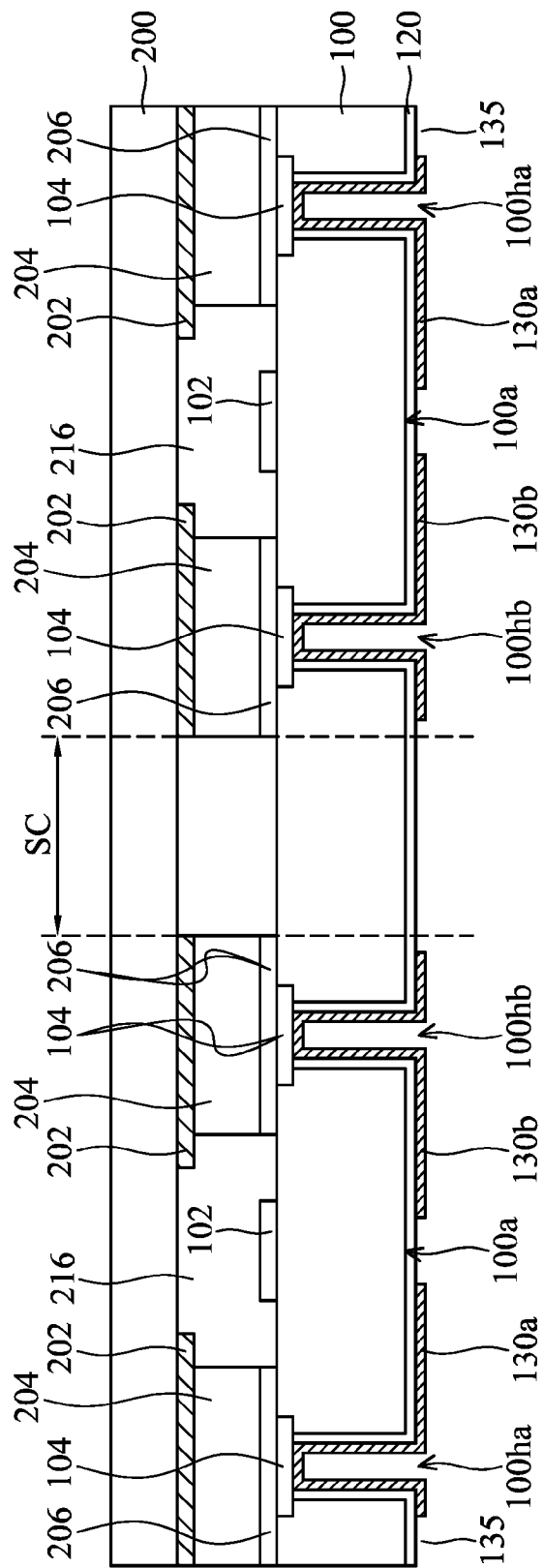

Next, as shown in FIG. 2F, a first conductive layer 130a and a second conductive layer 130b are respectively formed in the openings 100ha and 100hb. In this embodiment, the first conductive layer 130a and the second conductive layer 130b are redistribution patterns. Therefore, the first conductive layer 130a and the second conductive layer 130b are further formed extending on the lower surface 100a of the semiconductor substrate 100 in addition to extending on the sidewalls of the openings 100ha and 100hb.

The formation method of the first conductive layer 130a and the second conductive layer 130b may comprise processes such as physical vapor deposition, chemical vapor deposition, electroplating or electroless plating processes. The first conductive layer 130a and the second conductive layer 130b may be formed of metal materials, for example, Cu, Al, or Ag or combinations thereof. The first conductive layer 130a and the second conductive layer 130b may be further formed of conductive oxides, for example, indium titanium oxide (ITO), or indium zinc oxide (IZO) or combinations thereof. In one embodiment, a conductive layer is conformably formed on the entire semiconductor substrate 100, and then the conductive layer is patterned to form the conductive pattern distributions as shown in FIG. 2F; thereby forming conductive paths. The conductive layer is conformably formed on the sidewalls of the openings 100ha and 100hb as shown in FIG. 2E. However, in other embodiments, the conductive layer can also substantially fill the openings 100ha and 100hb. Moreover, in this embodiment, the first conductive layer 130a and the second conductive layer 130b in the openings 100ha and 100hb are isolated from the semiconductor substrate 100 by a single insulating layer 120. Additionally, the composition and disposition of the conductive paths in the aforementioned embodiment is only for description in one of the embodiments, and are not limiting. For example, the conductive paths may also be formed on positions of the scribe lines.

Figure 2G:
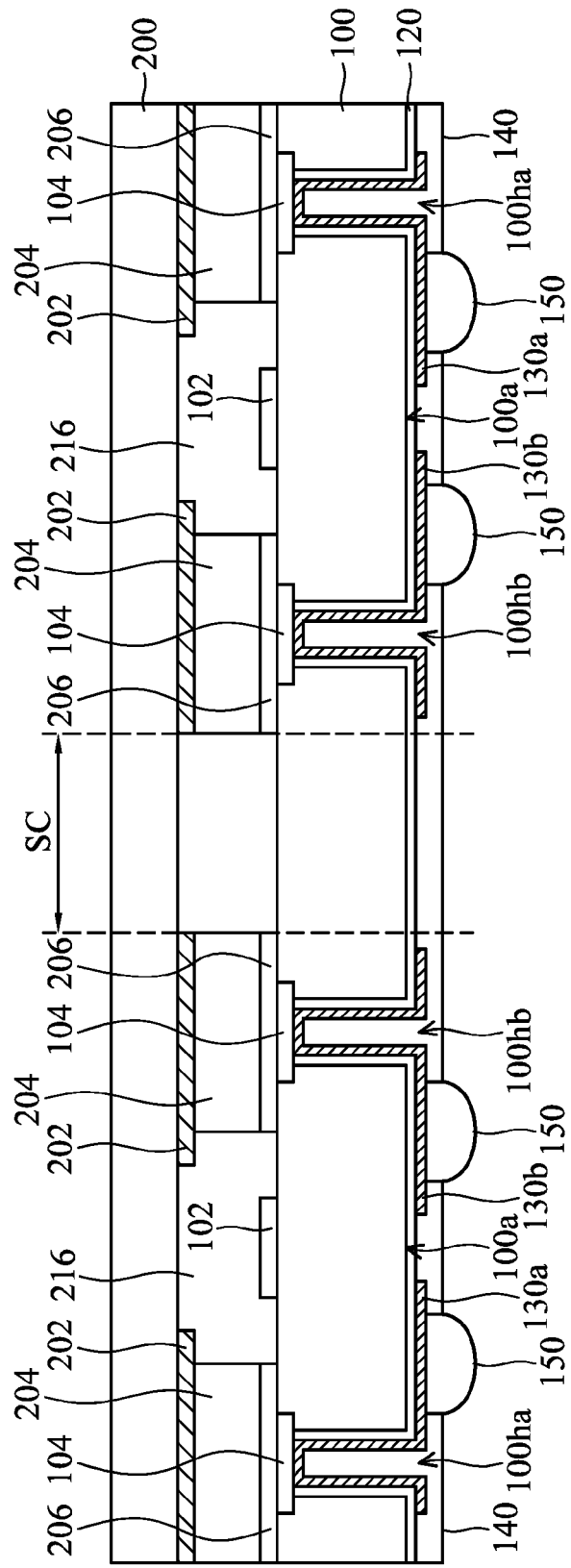

Next, FIG. 2G shows a formation of a passivation layer 140. In one embodiment, the passivation layer 140 may be, for example, a solder mask. The passivation layer 140 may be formed on the backside 100a of the semiconductor substrate by a method, such as, coating of a solder material. Next, a patterning process is performed on the passivation layer 140 to form terminal contact openings exposing a portion of the first conductive layer 130a and the second conductive layer 130b. Next, under bump metallurgy (UBM) layers (not shown) and conductive bumps 150 are formed in positions of the terminal contact openings. For example, the UBM layers formed by conductive materials may be metals or metal alloys such as Ni layers, Ag layers, Al layers, or Cu layers or alloys thereof, or materials of doped polysilicon, monocrystalline silicon or conductive glasses. Additionally, refractory metal materials such as titanium, molybdenum, chromium or titanium tungsten layers can be used to individually form the UBM layers or be combined with other metal layers. In a specific embodiment, a Ni/Ag layer may be formed on a portion of a surface or the entire surface of the metal layer. The conductive bumps 150 may be electrically connected to the conductive pad structures 104 through the first conductive layer 130a and the second conductive layer 130b. Next, the semiconductor substrate 100 is cut along a scribe line region SC in the peripheral bonding pad region, to form a plurality of divided package structures for chips.

Figure 2H:
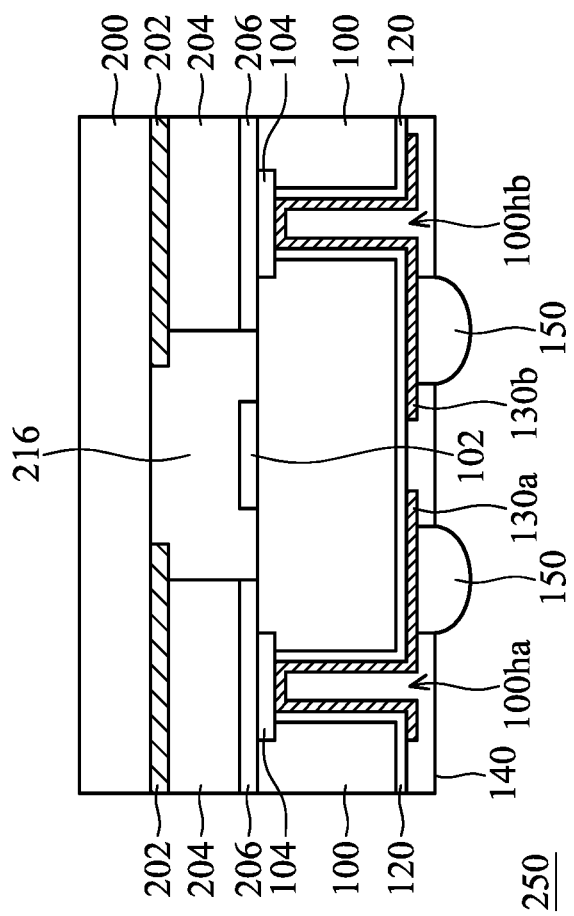

FIG. 2H shows a cross section view of a divided chip package 250. As shown in FIG. 2H, the chip package 250 may comprise: a chip; a photo-sensing region 102a having a semiconductor device formed on the chip; a cap layer 200 formed over the chip; and a spacer layer 204 formed between the cap layer 200 and the chip, wherein the cap layer 200 surrounds the semiconductor device 102 and forms a cavity 216. In addition, an anti-reflective layer 202 is formed between the cap layer 200 and the spacer layer 204. The spacer layer 204 covers the top surface of the spacer layer 204 and extends into the cavity. Furthermore, an adhesive layer 206 is further formed between the spacer layer 204 and the chip.

Figure 3A:
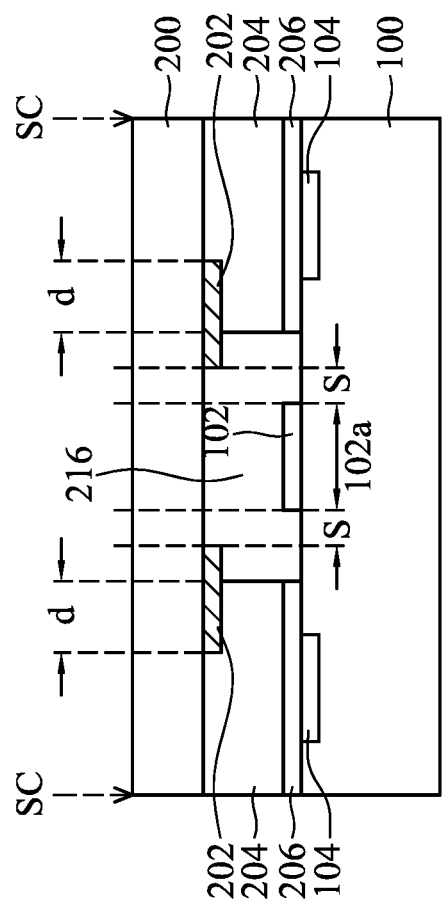
FIGS. 3A through 3B illustrate cross views of intermediate stages when forming a chip package in accordance with another embodiment of the present invention.
Figure 3B:
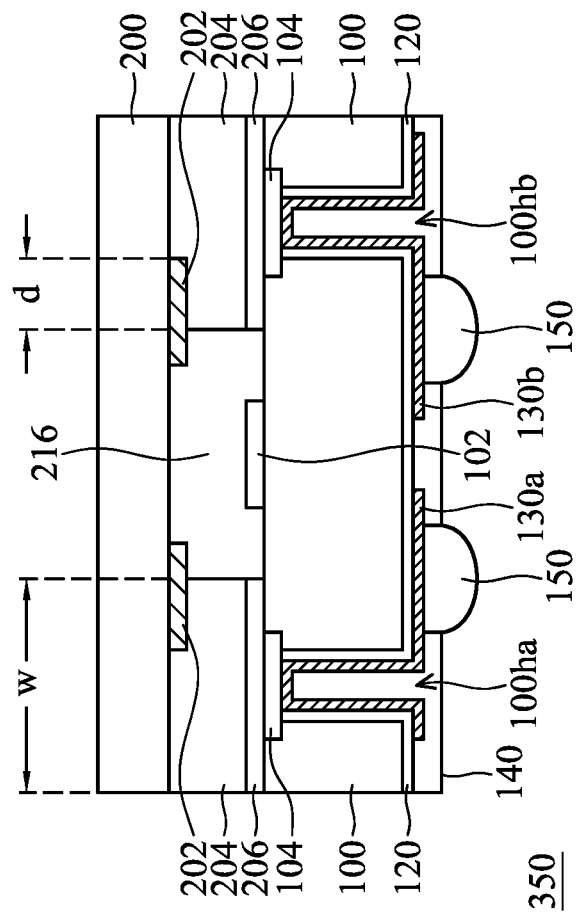

FIGS. 3A through 3B show a varied embodiment in accordance with the above embodiment of the present invention. In this embodiment, same reference numbers mean similar materials or formation methods as described in the above embodiments. As shown in FIG. 3A, an anti-reflective layer 202 may only partially cover the top surface of the spacer layer 204. In one embodiment, the overlapping region d may be adjusted depending on desired requirements. For example, a minimum value of the overlapping region d may be about 5 µm or be not more than half the width W of the spacer layer 204. Alternatively, the overlapping region d may be substantially equal to the width W of the spacer layer 204. Next, the processes described in FIGS. 2D through 2H are performed, to form a chip package 350 as shown in FIG. 3B.

FIGS. 4A through 4D show cross section views at intermediate stages of another embodiment in accordance with the present invention. In this embodiment, same reference numbers mean similar materials or formation methods as described in the above embodiments. The main difference between this embodiment and the above embodiments is that the spacer layer 204 is directly formed on the wafer (dam-on-wafer). Please refer to FIG. 4A firstly, a wafer 100 fabricated in FIG. 1B is provided. A spacer layer 204 is formed on the wafer 100 by processes such as deposition and photolithography processes and surrounds the photo-sensing device 102.

Next, please refer to FIG. 4B, a cap layer 200 is provided and an anti-reflective layer 202 is formed on the cap layer 200. As described above, the anti-reflective layer 202 may comprise a black resin, bottom anti-reflective coating (BARC), metal materials such as chromium (Cr), or other organic/inorganic light absorbing materials such as a dye or pigment. Alternatively, the anti-reflective layer 202 may comprise a plurality of films which absorb lights of different wavelengths. For example, each of the films may have individual wavelength ranges for absorbing light, or in addition, the wavelength ranges may be complementary to each other. The anti-reflective layer 202 and photo-sensing device 102 may have a horizontal spacing distance S therebetween. In one embodiment, the horizontal spacing distance S between the photo-sensing device 102a and the anti-reflective layer 202 may be between about 2 µm and about 100 µm. Preferably, the horizontal spacing distance S between the photo-sensing device 102a and the anti-reflective layer 202 may be between about 5 µm and about 40 µm.

Figure 4C:
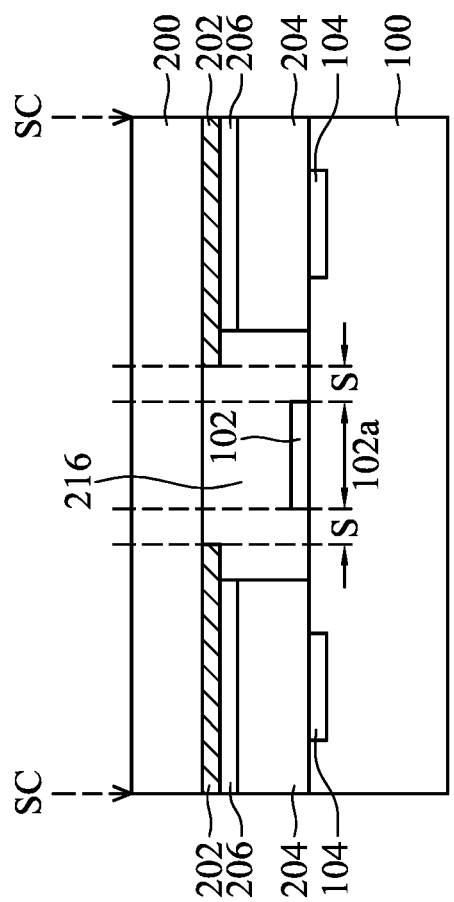

Next, please refer to FIG. 4C, an adhesive layer 206 is formed on the spacer layer by a print method. The cap layer 200 may be bonded to the wafer 100 via the adhesive layer 206 disposed on the spacer layer 204. Accordingly, the spacer layer 204 is between the wafer 100 and the cap layer 200 and surrounds the photo-sensing device 102; thereby forming a cavity 216 between the wafer 100 and the cap layer 200. It should be noted that, the anti-reflective layer 202 may have a pattern larger than that of the spacer layer 204 such that the anti-reflective layer 202 can cover the top surface of the spacer layer 204 and extend into the cavity 216 after the bonding of the wafer 100 and the cap layer 200.

Figure 4D:
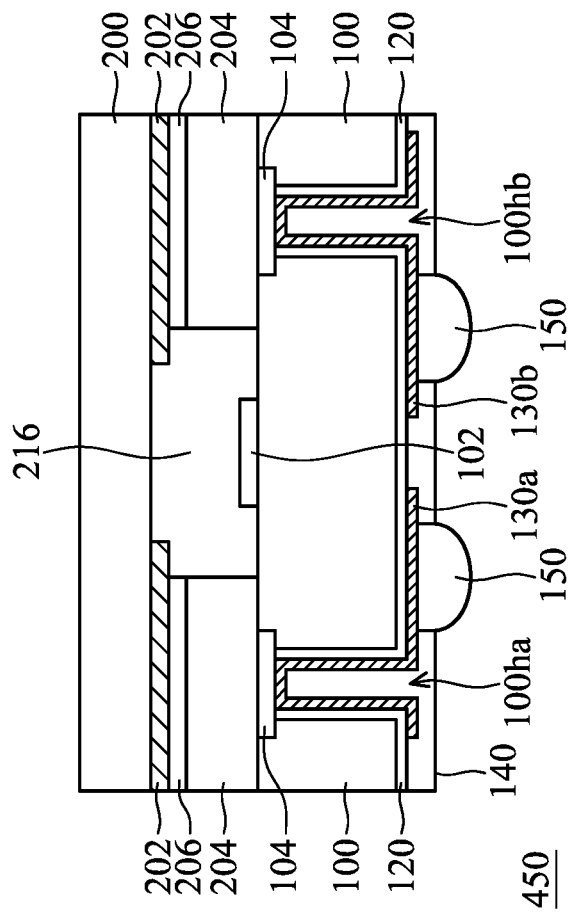

Then, the processes described in FIGS. 2D through 2H is performed after the bonding of the wafer 100 and the cap layer 20, to form a chip package 450 as shown in FIG. 4D. The chip package may comprise: a chip; a photo-sensing region 102a having a semiconductor device formed on the chip; a cap layer 200 formed over the chip; and a spacer layer 204 formed between the cap layer 200 and the chip, wherein the cap layer 200 surrounds the semiconductor device 102 and forms a cavity. In addition, an anti-reflective layer 202 is formed between the cap layer 200 and the spacer layer 204. The spacer layer 204 covers the top surface of the spacer layer 204 and extends into the cavity 216. Furthermore, an adhesive layer 206 is further formed between the spacer layer 204 and the anti-reflective layer 202. Note that, in other embodiments, the anti-reflective layer 202 may only partially cover the top surface of the spacer layer 204, as shown in FIG. 3B.

Figure 5A:
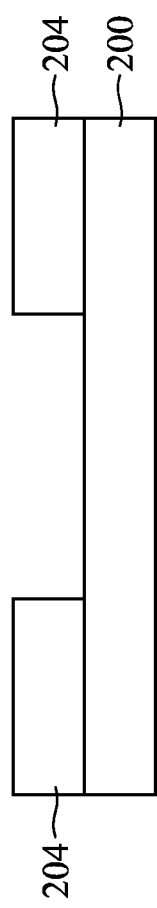
FIGS. 5A through 5D illustrate cross views of intermediate stages when forming a chip package in accordance with yet another embodiment of the present invention.
Figure 5B:
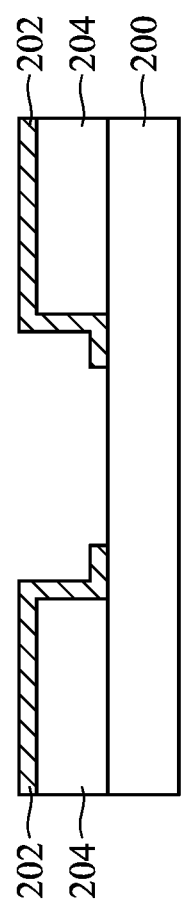

FIGS. 5A through 5D show cross section views at intermediate stages of yet another embodiment in accordance with the present invention. In this embodiment, the same reference numbers mean similar materials or formation methods described in the above embodiments. The main difference between this embodiment and the above embodiments is that the spacer layer 204 conformally covers the spacer layer and the cap layer. Please refer to FIG. 5A. A spacer layer 204 is formed on a cap layer 200 by processes such as deposition and photolithography processes. Then, as shown in FIG. 5A, an anti-reflective layer 202 is conformally deposited on the spacer layer 204 and the cap layer 200 by processes such as coating or deposition processes. Note that, as shown in FIG. 5B, the anti-reflective layer 202 not only covers the top surface of the spacer layer 204, but also extends to cover a portion of the cap layer 200 and a sidewall of the spacer layer 204. As described above, the anti-reflective layer 202 may comprise a black resin, bottom anti-reflective coating (BARC), metal materials such as chromium (Cr), or other organic/inorganic light absorbing materials such as a dye or pigment. Alternatively, the anti-reflective layer 202 may comprise a plurality of films which absorb lights of different wavelengths. For example, each of the films may have individual wavelength ranges for absorbing light, or in addition, the wavelength ranges which may be complementary to each other.

Figure 5C:
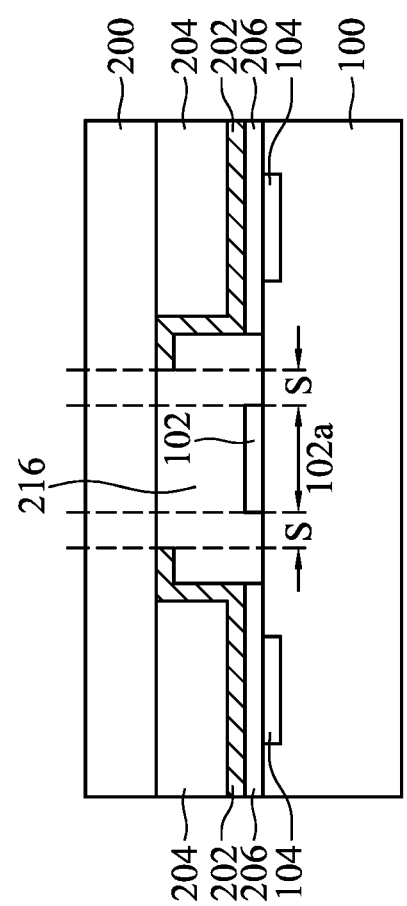

Then, referring to FIG. 5C, an adhesive layer 206 is formed on the anti-reflective layer 202, and the wafer 100 and the cap layer 200 are bonded via the adhesive layer 206. The spacer layer 204 forms a cavity 216 between the wafer 100 and the cap layer 200. It can be realized that the anti-reflective layer 202 and photo-sensing device 102 may have a horizontal spacing distance S therebetween. In one embodiment, the horizontal spacing distance S between the photo-sensing device 102a and the anti-reflective layer 202 may be between about 2 μm and about 100 μm, or preferably between about 5 μm and about 40 μm. Therefore, the photo-sensing device 102a is surrounded by the spacer layer 204. The spacer layer 204 has a portion extending into the cavity 216.

Figure 5D:
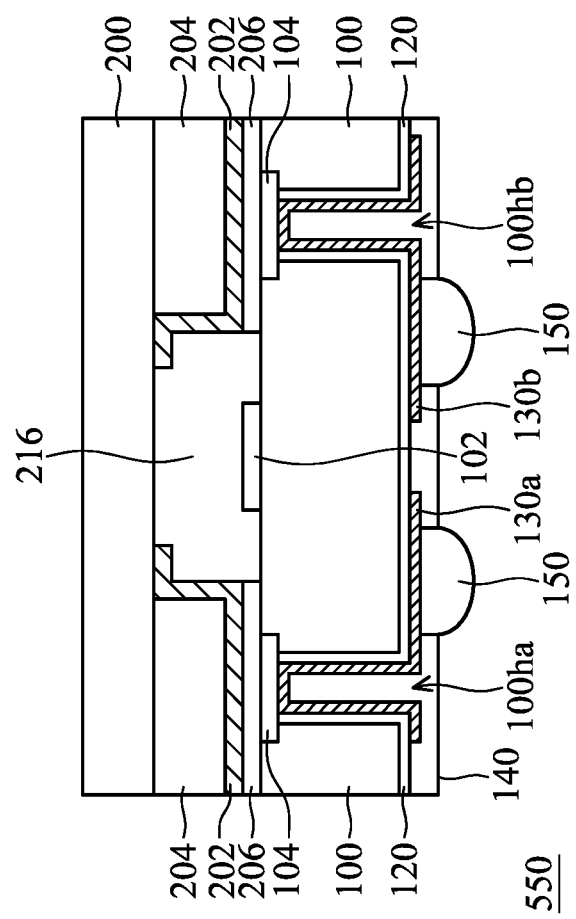

Next the processes described in FIGS. 2D through 2H is performed, to form a chip package 550, as shown in FIG. 5D. The chip package 550 may comprise: a chip; a photo-sensing region 102a having a semiconductor device 102 formed on the chip; a cap layer 200 formed over the chip; and a spacer layer 204 formed between the cap layer 200 and the chip, wherein the cap layer 200 surrounds the semiconductor device 102 and forms a cavity 216. In addition, an anti-reflective layer 202 is formed between the spacer layer 204 and the chip. The anti-reflective layer 202 extends onto the cap layer 200 along a sidewall of the spacer layer 204. Furthermore, an adhesive layer 206 is further formed between the anti-reflective layer 202 and the chip. Note that, in other embodiments, the anti-reflective layer 202 may only partially cover the top surface of the spacer layer 204, as shown in FIG. 3B.

In various embodiments of the present invention, an anti-reflective layer between the chip and a cap layer over the chip is provided. Therefore, optical crosstalk occurring in conventional technology resulting from light incident to a non-photo-sensitive region (for example, light is incident to a spacer layer) refracting to a sensing region or light incident to an adjacent image sensor device is mitigated. In addition, the anti-reflective layer may be directly formed on the cap layer or the spacer layer, or only partially cover the top surface of the spacer layer. Therefore, optimal performance of the chip package may be achieved by adjusting the above described features depending on desired designs or process requirements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising
   a chip having a semiconductor device thereon;
   a cap layer over the semiconductor device;
   a spacer layer between the chip and the cap layer, wherein the spacer layer surrounds the semiconductor device and forms a cavity between the chip and the cap layer;
   an anti-reflective layer formed between the cap layer and the spacer layer and located only a side of the chip, wherein the anti-reflective layer has an overlapping region with the spacer layer and extends into the cavity; and
   an adhesive layer disposed between the anti-reflective layer and the spacer layer or between the spacer layer and the cap layer.

2. The chip package as claimed in claim 1, wherein the semiconductor device and the anti-reflective layer have a horizontal distance therebetween.

3. The chip package as claimed in claim 2, wherein the horizontal distance is between about 2 μm and about 100 μm.

4. The chip package as claimed in claim 1, wherein the overlapping region is equal to a width of the spacer layer.

5. The chip package as claimed in claim 1, wherein the minimum value of the overlapping region is not more than half the width of the spacer layer.

6. The chip package as claimed in claim 1, wherein the anti-reflective layer comprises dye, pigment, metal material, black-resin, or an anti-reflective coating or combinations thereof.

7. The chip package as claimed in claim 1, wherein the anti-reflective layer comprises a plurality of films which absorb lights of different wavelengths.

8. A method for fabricating the chip package, comprising:
   providing a cap layer and a wafer including a plurality of chips, wherein each of the chips has a semiconductor device thereon;
   bonding the cap layer and the wafer with a spacer layer and an anti-reflective layer therebetween, wherein the spacer layer surrounds the semiconductor device and forms a cavity between the cap layer and the chip, and the anti-reflective layer is on only a side of the chip and extends to the cavity, wherein the anti-reflective layer has an overlapping region with the spacer layer, wherein bonding the cap layer and the wafer comprises:
forming the spacer layer on the chip;
forming the anti-reflective layer on the cap layer; and
bonding the spacer layer and the anti-reflective layer through an adhesive layer.

9. The method for fabricating the chip package as claimed in claim 8, wherein the semiconductor device and the anti-reflective layer have a horizontal distance therebetween.

10. The method for fabricating the chip package as claimed in claim 8, wherein the anti-reflective layer comprises dye, pigment, metal material, black-resin, or an anti-reflective coating or combinations thereof.

11. The method for fabricating the chip package as claimed in claim 8, wherein the anti-reflective layer comprises a plurality of films which absorb lights of different wavelengths.

12. A chip package, comprising:
a chip having a semiconductor device thereon;
a cap layer over the semiconductor device;
a spacer layer between the chip and the cap layer, wherein the spacer layer surrounds the semiconductor device and forms a cavity between the chip and the cap layer; and
an anti-reflective layer formed between the cap layer and only a side of the chip, wherein the anti-reflective layer has an overlapping region with the spacer layer and extends into the cavity, wherein the space layer is disposed between the anti-reflective layer and the cap layer.

13. The chip package as claimed in claim 12, wherein the semiconductor device and the anti-reflective layer have a horizontal distance therebetween.

14. The chip package as claimed in claim 12, wherein the horizontal distance is between about 2 μm and about 100 μm.

15. The chip package as claimed in claim 12, wherein the anti-reflective layer comprises dye, pigment, metal material, black-resin, or an anti-reflective coating or combinations thereof.

16. The chip package as claimed in claim 12, wherein the anti-reflective layer comprises a plurality of films which absorb lights of different wavelengths.

17. The chip package as claimed in claim 12, wherein the overlapping region extends onto the cap layer along a sidewall of the spacer layer.

18. A chip package, comprising:
a chip having a semiconductor device thereon;
a cap layer over the semiconductor device;
a spacer layer between the chip and the cap layer, wherein the spacer layer surrounds the semiconductor device and forms a cavity between the chip and the cap layer; and
an anti-reflective layer formed between the cap layer and only a side of the chip, wherein the anti-reflective layer has an overlapping region with the spacer layer and extends into the cavity, wherein the anti-reflective layer comprises a plurality of films which absorb lights of different wavelengths.

19. A method for fabricating the chip package, comprising:
providing a cap layer and a wafer including a plurality of chips, wherein each of the chips has a semiconductor device thereon;
bonding the cap layer and the wafer with a spacer layer and an anti-reflective layer therebetween, wherein the spacer layer surrounds the semiconductor device and forms a cavity between the cap layer and the chip, and the anti-reflective layer is on only a side of the chip and extends to the cavity, wherein the anti-reflective layer has an overlapping region with the spacer layer, wherein bonding the cap layer and the wafer comprises:
forming the anti-reflective layer on the cap layer;
forming the spacer layer on and partially covering the anti-reflective layer, and bonding the spacer layer to the chip through an adhesive layer.

20. A method for fabricating the chip package, comprising:
providing a cap layer and a wafer including a plurality of chips, wherein each of the chips has a semiconductor device thereon;
bonding the cap layer and the wafer with a spacer layer and an anti-reflective layer therebetween, wherein the spacer layer surrounds the semiconductor device and forms a cavity between the cap layer and the chip, and the anti-reflective layer is on only a side of the chip and extends to the cavity, wherein the anti-reflective layer has an overlapping region with the spacer layer, wherein bonding the cap layer and the wafer comprises:
forming the spacer layer on the cap layer;
conformally forming the anti-reflective layer on the spacer layer and the chip; and bonding the anti-reflective layer to the spacer layer and the chip through an adhesive layer.

21. The method for fabricating the chip package as claimed in claim 20, wherein the anti-reflective layer covers a sidewall of the spacer layer.

* * * * *